United States Patent
Chandross et al.

(10) Patent No.: US 6,268,089 B1
(45) Date of Patent: Jul. 31, 2001

(54) PHOTORECORDING MEDIUM AND PROCESS FOR FORMING MEDIUM

(75) Inventors: Edwin Arthur Chandross, Murray Hill; Valerie Jeanne Kuck, Upper Montclair; Ralph E. Taylor-Smith, Dunnellen, all of NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/027,596

(22) Filed: Feb. 23, 1998

(51) Int. Cl.$^7$ ...................................................... G03H 1/04

(52) U.S. Cl. .................. 430/1; 430/2; 430/290; 359/3; 65/17.5; 65/17.3

(58) Field of Search .................. 430/1, 2, 290; 359/1, 3; 65/17.2, 17.3, 17.5

(56) References Cited

U.S. PATENT DOCUMENTS

| | | | |
|---|---|---|---|
| 2,315,328 | * 3/1943 | Hood et al. .............................. | 501/39 |
| 3,389,114 | 6/1968 | Burzynski et al. .................. | 260/32.8 |
| 3,428,599 | 2/1969 | Newing et al. ...................... | 260/46.5 |
| 3,474,070 | 10/1969 | Levene ................................ | 260/46.5 |
| 3,479,316 | 11/1969 | Levene ................................ | 260/33.4 |

(List continued on next page.)

FOREIGN PATENT DOCUMENTS

| | | | |
|---|---|---|---|
| 0353864 | 2/1990 | (EP) . | |
| 0824222 | 2/1998 | (EP) . | |
| 2283493 | 5/1995 | (GB) . | |
| 03154006 | 7/1991 | (JP) . | |
| 03154007 | 7/1991 | (JP) . | |
| 6-019040 | * 1/1994 | (JP) ......................................... | 430/1 |
| 6-148880 | * 5/1994 | (JP) ......................................... | 430/1 |

OTHER PUBLICATIONS

Glebov et al., "photorefraction in porous xerogel–photopolymer composite materials", Sov. Tech. Phys. Lett., vol. 16(6) pp. 445–446, Jun. 1990.*

"Holographic Memories", by Psaltis, D. et al *Scientific American*, pp. 70–77 (Nov. 1995).

"Polymers for Holography", by Smothers, W. K. et al, *SPIE*, vol. 1212, Practical Holography IV, pp. 20–29 (1990).

*Primary Examiner*—Martin Angebranndt
(74) *Attorney, Agent, or Firm*—Scott J. Rittman

(57) ABSTRACT

An improved photorecording medium suitable for use in holographic storage systems contains a glassy hybrid inorganic-organic, three dimensional matrix, in which is distributed a photoimageable system comprising one or more photoactive, organic monomers. The medium is fabricated by providing a precursor of the hybrid inorganic-organic matrix, mixing the matrix precursor with the photoimageable system, and curing the matrix precursor to form the matrix in situ. The matrix and photoimageable system exhibit independent chemistries, such that the step of matrix formation does not substantially affect the photoimageable system. The hybrid matrix precursor is typically an oligomer derived from a compound represented by $R_nM(OR')_{4-n}$, where M is a metallic element having a valence of three or higher, such as silicon, titanium, germanium, zirconium, vanadium, or aluminum, R is an alkyl or aryl, R' is a lower alkyl, and n ranges from 1 to 2. The hybrid nature of the matrix material provides several advantages. The inorganic character offers thermal, mechanical, and chemical stability, and also reduces both the bulk viscoelastic creep and the bulk polymerization-induced shrinkage typically exhibited by media utilizing organic polymer matrices. The organic character provides compatibility between the matrix precursor and the organic components (e.g., the photoactive monomer) of the photoimageable system, allowing homogeneous mixing during fabrication of the medium. The organic moieties also offer some flexibility to the matrix, and, it appears, ease diffusion of the photoactive monomer within the matrix during exposure, thereby improving the process of storing data.

2 Claims, 7 Drawing Sheets

U.S. PATENT DOCUMENTS

| | | | |
|---|---|---|---|
| 3,957,497 | 5/1976 | Gray et al. | 106/48 |
| 4,223,121 | 9/1980 | Burzynski | 528/12 |
| 4,242,252 | 12/1980 | Newing | 260/33.4 |
| 4,338,375 * | 7/1982 | Hashimoto et al. | 428/412 |
| 4,539,232 | 9/1985 | Burzynksi et al. | 427/387 |
| 4,551,361 | 11/1985 | Burzynski et al. | 427/164 |
| 4,798,629 * | 1/1989 | Wood et al. | 106/287.16 |
| 4,842,968 | 6/1989 | Kojima et al. | 430/1 |
| 5,116,703 | 5/1992 | Badesha et al. | 430/59 |
| 5,196,282 * | 3/1993 | Knobbe | 430/2 |
| 5,231,156 | 7/1993 | Lin | 526/279 |
| 5,384,376 | 1/1995 | Tunney et al. | 525/431 |
| 5,412,043 | 5/1995 | Novak et al. | 525/479 |
| 5,527,871 | 6/1996 | Tani et al. | 528/10 |
| 5,717,051 * | 2/1998 | Hiraoka et al. | 528/9 |
| 5,719,691 | 2/1998 | Curtis et al. | 359/11 |
| 6,077,629 * | 6/2000 | Parker et al. | 430/1 |

* cited by examiner ppm vs TMS ppm vs TMS

PHOTORECORDING MEDIUM AND PROCESS FOR FORMING MEDIUM

BACKGROUND OF THE INVENTION

1. Field of the Invention

The invention relates to information storage media, in particular media useful with holographic storage systems.

2. Discussion of the Related Art

Developers of information storage devices and methods continue to seek increased storage capacity. As part of this development, page-wise memory systems, in particular holographic systems, have been suggested as alternatives to conventional memory devices. Page-wise systems involve the storage and readout of entire two-dimensional pages of data. Specifically, recording light passes through a two-dimensional array of dark and transparent areas representing a page of data, and the holographic system stores, in three dimensions, holographic representations of the pages as patterns of varying refractive index and/or absorption imprinted into a storage medium. Holographic systems are discussed generally in D. Psaltis et al., "Holographic Memories," *Scientific American*, November 1995, the disclosure of which is hereby incorporated by reference. One method of holographic storage is phase correlation multiplex holography, which is described in U.S. Pat. No. 5,719,691 issued Feb. 17, 1998, the disclosure of which is hereby incorporated by reference. In phase correlation multiplex holography, a reference light beam is passed through a phase mask, and intersected in the recording medium with a signal beam that has passed through an array representing data, thereby forming a hologram in the medium. The relation of the phase mask and the reference beam is adjusted for each successive page of data, thereby modulating the phase of the reference beam and allowing the data to be stored at overlapping areas in the medium. The data is later reconstructed by passing a reference beam through the original storage location with the same phase modulation used during data storage.

The capabilities of holographic storage systems are limited in part by the storage media. Iron-doped lithium niobate has been used as a storage media for research purposes for many years. However, lithium niobate is expensive, exhibits poor sensitivity, and tends to introduce noise during read-out of the stored information. Alternatives have therefore been sought, particularly in the area of photosensitive polymer films. See, e.g., W. K. Smothers et al., "Photopolymers for Holography," SPIE OE/Laser Conference, 1212-03, Los Angeles, Calif. 1990. The material described in this article contains a photoimageable system of a liquid monomer material and a photoinitiator (which promotes the polymerization of the monomer upon exposure to light), in a matrix organic polymer that is substantially inert to the exposure light. During writing of information into the material (by passing recording light through an array representing data), the monomer polymerizes in the exposed regions. Due to the resultant lowering of the monomer concentration, monomer from the dark, unexposed regions of the material diffuses to the exposed regions. The polymerization and resulting concentration gradient create a refractive index change, forming the hologram containing the data. Unfortunately, deposition of the pre-formed matrix material containing the photoimageable system requires use of solvent, and the thickness of the material is therefore limited, e.g., to no more than about 150 $\mu$m, to allow adequate evaporation of the solvent. In addition, polymerization-induced bulk shrinkage of 4–10% detrimentally affects the reliability of data retrieval (bulk indicating that the shrinkage occurs through the whole of the material).

U.S. patent application Ser. No. 08/698,142 (our reference Colvin-Harris-Katz-Schilling 1-2-16-10), the disclosure of which is hereby incorporated by reference, relates to a polymeric holographic medium. The medium is formed by mixing oligomeric matrix precursor and photoactive monomer, and photo-curing the mixture such that (a) the matrix is formed from the oligomer, and (b) at least a portion of the monomer remains unreacted and thus available for holographic recording. Because no solvent is required for deposition of these materials (since the mixture is fluid), greater thicknesses are possible, e.g., 1 mm and above. Although the material has many attributes, greater resolution would be possible if bulk shrinkage of the medium during writing could be limited.

Attempts to provide a photoimageable system containing a monomer in a glass matrix have also been made. U.S. Pat. No. 4,842,968 discloses a porous glass matrix in which the pores are filled with a photoimageable system. The porous glass is placed into a container of the photoimageable system, where the photoimageable system diffuses into the pores. After exposure to light, the unexposed, i.e., non-polymerized, portions of the photoimageable system must be removed from the pores with a solvent, and a different material is typically substituted into the emptied pores. The glass matrix offers desirable structural integrity, in contrast to media containing polymer matrices, and also allows formation of relatively thick, e.g., greater than 1 mm, photorecording media useful for holographic storage systems. However, the medium of this patent has several practical drawbacks. Specifically, complex chemical treatments are required to remove unreacted monomer, and there is small latitude in defining the structure, volume percent porosity, pore size, and pore interconnectivity in the preformed glass.

Thus, while progress has been made in fabricating photorecording media suitable for use in holographic storage systems, further progress is needed. In particular, media which have improved chemical and structural integrity, which are capable of being formed in relatively thick, e.g., greater than 1 mm, layers without complex chemical treatments, and which allow some latitude in selecting matrix properties, are desired.

SUMMARY OF THE INVENTION

The invention relates to an improved photorecording medium suitable for use in holographic storage systems, a process for making the medium, and a process for holography utilizing the medium. The medium contains a hybrid inorganic-organic, three dimensional matrix, in which is distributed a photoimageable system comprising one or more photoactive organic monomers. The hybrid inorganic-organic matrix contains a three-dimensional inorganic backbone, e.g., Si—O—Si—O, with organic moieties, e.g., alkyl and/or aryl, attached to the backbone, and the matrix is advantageously glassy. (Glassy indicates a glass transition temperature ($T_g$) at least 20° C. higher than the temperature of use, typically a $T_g$ of at least 45° C. As used herein, a photoactive monomer is a molecule that polymerizes in response to exposure to certain wavelengths of light, whether directly in response to the light or by inducement from another material, i.e., a photoinitiator, due to that other material's exposure to light.)

The recording medium is fabricated by providing a precursor of the hybrid inorganic-organic matrix, mixing the matrix precursor with the photoimageable system, and curing the mixture to form the matrix in situ (the term in situ indicating that the matrix is formed in the presence of the photoimageable system). The matrix and the photoimageable system are selected to exhibit independent chemistries, meaning that the mechanism of matrix formation differs from that of hologram inscription, i.e., the process by which the matrix is formed from the precursor will neither (a) substantially induce polymerization of the photoactive monomer nor (b) substantially inhibit subsequent polymerization of the monomer during hologram writing. For example, the matrix is typically formed by a thermal cure of the precursor, while the photoactive monomer of the photoimageable system is designed to polymerize by exposure to radiation. The matrix formation therefore typically does not substantially affect the information storage capability of the photoimageable system, although some heat-induced polymerization of the photoactive monomer typically occurs during the matrix cure.

The hybrid matrix precursor is typically an oligomer derived by hydrolysis and condensation from a compound represented by $R_nM(OR')_{4-n}$, where M is a metallic element that has a valence of three or higher, e.g., silicon, titanium, germanium, zirconium, vanadium, and aluminum (silicon is considered a metallic element for purposes of the invention), R is an alkyl or aryl, such as methyl or phenyl, R' is a lower alkyl with up to 4 carbon atoms, and n ranges from 1 to 2. Advantageously, the hybrid matrix precursor contains an oligomer derived from a trifunctional organoalkoxysilane (i.e., an organotriethoxysilane), which results in a final matrix of a branch siloxane ladder network with organic moieties attached thereto (and residual hydroxy and alkoxy groups). (A branch siloxane ladder network is a three-dimensional network of Si—O—Si—O formed from hydrolytic condensation of trifunctional and difunctional organoalkoxysilanes, wherein at least 20% of the Si atoms are bonded to three O atoms.)

Typically, the matrix precursor is pre-cured prior to mixing with the photoimageable system. (Pre-cure indicates a step of increasing the viscosity of the precursor by inducing further condensation.) The pre-cure typically results in partial formation of the matrix structure prior to adding the photoimageable system, such that it is possible to perform the final cure at a time and temperature mild enough to substantially avoid any heat-induced polymerization of the photoactive monomer that would occur without a precure step. (Premature indicates polymerization of the photoactive monomer prior to the step of writing data.)

The hybrid nature of the matrix material provides several advantages. The inorganic backbone offers thermal, mechanical, and chemical stability. The inorganic backbone also reduces both the bulk viscoelastic creep and the bulk polymerization-induced shrinkage typically exhibited by media utilizing organic polymer matrices. The organic moieties attached to the backbone provide compatibility between the matrix precursor and the organic components (e.g., the photoactive monomer) of the photoimageable system, allowing desirable dispersion of the photoimageable system in the matrix precursor during fabrication of the medium. In addition, larger organic moieties, e.g., aryls, provide increased free volume and reduced network density in the matrix, Such lowered network density appears to ease diffusion of the monomer within the matrix during exposure, thereby improving the process of storing data. In addition, selection of the organic moieties allows adjustments to the physical properties of the matrix.

The invention thereby provides a photorecording medium with a hybrid inorganic-organic matrix that offers chemical and mechanical stability, allows some latitude in selecting matrix properties, and is capable of being formed in relatively thick layers.

DETAILED DESCRIPTION OF THE INVENTION

Figure 1:
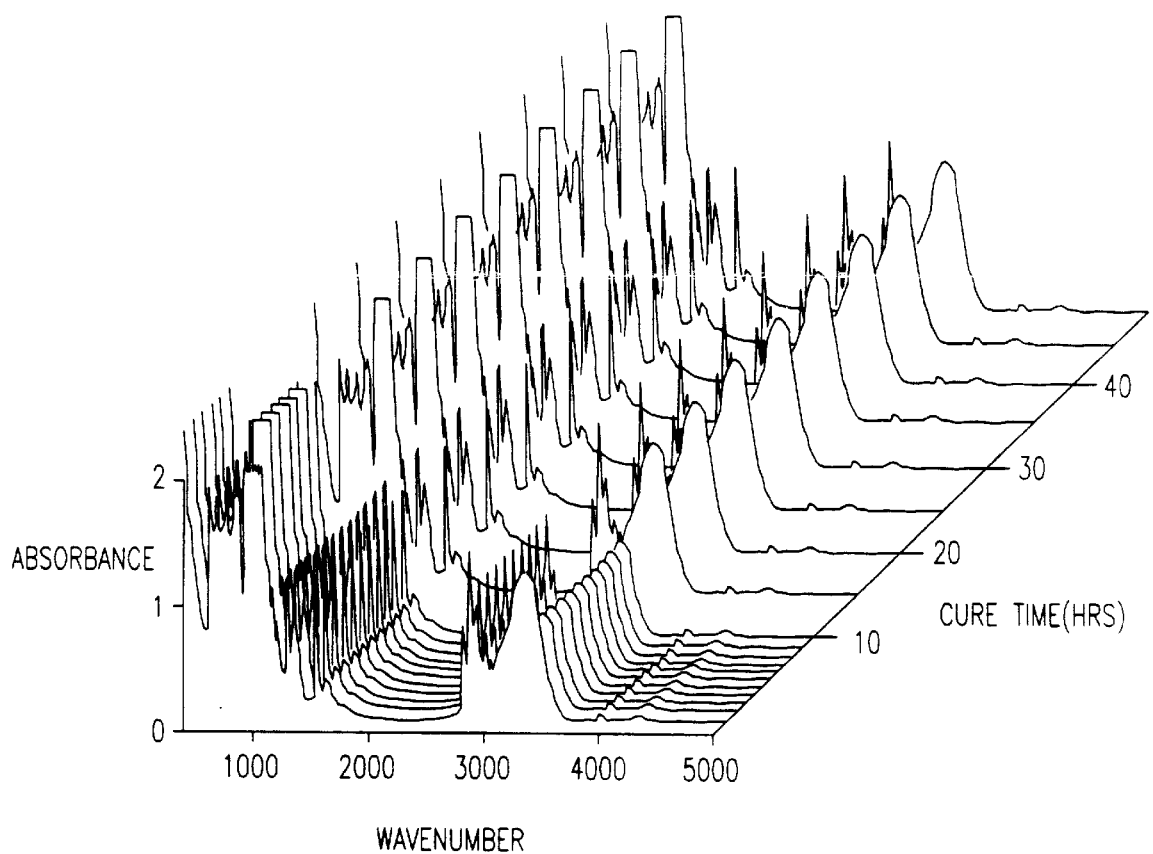
FIG. 1 shows the IR spectra over the course of a cure of a recording medium of the invention.

According to the process of the invention, a hybrid inorganic-organic matrix precursor is provided. The matrix precursor, typically an oligomeric material that has been somewhat further condensed, is mixed with a photoimageable system that typically contains one or more photoactive organic monomers and additional components such as a photoinitiator. The mixture is then cured to form the final matrix. (Inorganic, for purposes of the invention, indicates an element selected from Groups 4, 5, 13, and 14 of the Periodic Table, these Groups defined, for example in Hawley's Condensed Chemical Dictionary, 12th Ed.) The matrix and the photoimageable system are selected to exhibit independent chemistries, meaning that the mechanism of matrix formation differs from that of hologram inscription, i.e., the process by which the matrix is formed from the precursor will neither (a) substantially induce polymerization of the photoactive monomer nor (b) substantially inhibit subsequent polymerization of the monomer during hologram writing. Independent chemistries thus ensure that the in situ matrix formation will not substantially affect the information storage capability of the photoimageable system. The matrix is typically formed by a thermal cure of the precursor, and, because the photoactive monomer of the photoimageable system is designed to polymerize by exposure to radiation and to be relatively insensitive to matrix formation conditions, the matrix formation typically does not substantially affect the photoimageable system. As mentioned previously, however, some degree of heat-induced polymerization of the photoactive monomer typically occurs during a matrix cure. (Inhibition of subsequent polymerization refers to the possibility that matrix formation would lead to, for example, formation of species that would interfere with polymerization of the photoactive monomer.)

The hybrid matrix precursor is typically an oligomer derived from a compound represented by $R_nM(OR')_{4-n}$, where M is a metallic element that has a valence of three or higher, e.g., silicon, titanium, germanium, zirconium, vanadium, and aluminum (silicon is considered a metallic element for purposes of the invention), R is an alkyl or aryl, such as methyl or phenyl, R'is a lower alkyl with up to 4 carbon atoms, and n ranges from 1 to 2. At least a portion of the precursor should be trifunctional (n=1) to provide a three-dimensional matrix structure. It is possible to obtain oligomeric precursors commercially, particularly siloxane oligomers. Alternatively, it is possible to obtain monomeric precursor, in which case the associated oligomer is formed at some point prior to the process of fabricating the photorecording medium—typically before mixing of the precursor with the photoimageable system. Obtaining or forming an oligomeric precursor prior to mixing with the photoimageable system allows a milder final cure, thereby reducing the likelihood of premature polymerization of the photoactive monomer.

Matrix formation typically occurs by known mechanisms of alkoxide sol-gel chemistry. See, e.g., C. J. Brinker et al., Sol-Gel Science: Physics & Chemistry of Sol-Gel Processing, Academic Press, 1990. In accordance with standard alkoxide sol-gel chemistry, curing of a trifunctional oligomeric matrix precursor involves further condensation, by which the precursor forms a three-dimensional network. The organic moieties that are attached to the backbone of the final cured matrix affect the properties of the medium, e.g., flexibility, impact resistance, thermal shock resistance, refractive index, density, and abrasion resistance. It is possible for a combination of organic moieties, e.g., both methyl and phenyl, to be used to provide desired properties. For example, methyl increases compatibility of the hybrid matrix precursor with the photoimageable system and permits the use of mild cure conditions. Phenyl groups also offer such compatibility at the cost of reduced cure speed, and, due to phenyl's larger size, these groups also increase free volume and lower the network density of the matrix compared to a matrix with only methyl moieties. Lower network density promotes diffusion of the photoactive organic monomer during writing of data and adds some flexibility to the matrix. (Where the matrix precursor is derived from hydrolysis and condensation of a trifunctional organoalkoxysilane, diffusion is also enhanced by the inclusion of dimethylsilyl groups in the matrix backbone, which also improves thermal shock resistance, but decreases the rate of matrix condensation.) The organic moieties which are removed in the condensation reaction, e.g., R' above, typically affect the rate of matrix formation. For example, a precursor with attached methoxy groups will typically react faster than a precursor with attached ethoxy groups, which are larger, in accordance with the known trend of larger alkoxy groups resulting in slower reaction times.

Optionally, the hybrid matrix precursor is pre-cured, i.e., further condensed in the case of an oligomeric matrix precursor, prior to mixing with the photoimageable system. When a pre-cure is used to promote condensation of the matrix precursor, a milder final cure of the matrix precursor/photoimageable system mixture is typically required because the final cure is performed on substantially condensed oligomer. A milder cure is advantageous in that damage to the photoimageable system, such as heat-induced premature polymerization of the photoactive monomer, is generally reduced. The pre-cure is performed to an extent that allows substantial dispersion of the photoimageable system in the pre-cured precursor, but the conditions of the pre-cure will vary depending on the particular hybrid matrix precursor. In addition, it is possible to add an organic solvent such as acetone to thin the precursor after the pre-cure. Typically, the pre-cure will be performed at temperatures ranging from 100 to 200° C. for times less than an hour. A control sample easily provides information on acceptable conditions for the pre-cure.

Prior to mixing the hybrid matrix precursor, whether pre-cured or not, and the photoimageable system, the viscosity of the precursor is typically adjusted to about 1000 cps or less by addition of solvent to promote mixing. It is possible to adjust the viscosity by application of heat and/or by use of a solvent. Suitable solvents for the invention include alkanols with up to 4 carbon atoms and ketones with up to 4 carbon atoms, where the alkanols and ketones are capable of being evaporated from the matrix precursor/photoimageable system mixture at temperatures less than about 80° C. Acetone is particularly useful for a variety of matrix precursor materials, particularly those with a siloxane-based backbone. Where a solvent is used, the solvent is typically first mixed with the matrix precursor to reduce the viscosity of the precursor, and then the photoimageable system is mixed in with the solvated precursor. A solvent is particularly useful where the matrix precursor has been pre-cured, since the pre-cure increases the viscosity of the matrix precursor. Upon mixing, the hybrid matrix precursor and the photoimageable system advantageously form a solution of the photoimageable system in the solvated hybrid matrix precursor. The bulk of the solvent is removed by heating gently under vacuum, which also further drives the matrix condensation. The process is stopped when the desired weight is obtained.

The photoimageable system contains a photoactive organic monomer, which is induced to polymerize upon exposure of the photoimageable system to light that has passed through an array representing a page of data. In response to the lesser amounts of monomer in the irradiated regions caused by the polymerization, additional monomer diffuses from the dark to the exposed regions. The polymerization and resulting monomer concentration differences create a refractive index change, thereby forming a hologram of the data carried by the recording light. A variety of useful monomers, typically referred to as photomonomers, are known in the art and are useful in the invention. See, e.g., U.S. patent application Ser. No. 08/698,142, and W. K. Smothers et al., "Photopolymers for Holography," SPIE OE/Laser Conference, 1212-03, Los Angeles, Calif., 1990, both referenced previously. In selecting a photomonomer, considerations include the monomer's refractive index, particularly the contrast between the monomer's refractive index and the matrix's refractive index, as well as the rate of reactivity of the monomer. Monomers suitable for the medium of the invention include acrylate monomers, such as isobornyl acrylate, phenoxyethyl acrylate, and diethylene glycol monoethyl ether acrylate. Monomers having other functional groups, such as epoxides and vinyl ethers, are also suitable. It is possible to use a monomer that enhances the contrast between exposed and non-exposed portions of the medium. These contrast-enhancing monomers include acrylates such as 2-napthyl-1-oxyethyl acrylate and 2(N-carbazoyl-1-oxyethyl) acrylate. It is also possible to use monomers which exhibit a relatively low refractive index, e.g., less than 1.50. A mixture of monomers is useful in some situations to provide desired properties.

Typically, the photoimageable system further contains a photoinitiator. Direct light-induced polymerization of the monomer by exposure to light is often difficult, particularly as the thicknesses of recording media increase. The photoinitiator, upon exposure to relatively low levels of the recording light, chemically initiates the polymerization of the monomer, avoiding the need for direct light-induced polymerization of the monomer. The photoinitiator generally should be soluble in the matrix and largely unaffected by the final matrix cure, and should offer a source of species that initiate polymerization of the particular photomonomer. Typically, 0.1 to 5 wt. % photoinitiator, based on the weight of the photoimageable system, provides desirable results. A variety of photoinitiators known to those skilled in the art and available commercially are suitable for use in the invention. It is also possible to use other additives in the photoimageable system, e.g., inert diffusing agents having relatively high or low refractive indices.

The mixture of the matrix precursor and photoimageable system is given a final matrix cure to form the matrix in situ. The final matrix cure is advantageously performed under conditions which avoid substantial premature polymerization of the photoactive monomer in the photoimageable system. For example, as mentioned previously, a thermal matrix cure is typically advantageous because light-induced polymerization of the monomer is avoided. (It is conceivable, however, to perform a final matrix cure using a wavelength of light at which polymerization of the monomer is not substantially triggered.) Even during a thermal cure, however, some photoactive monomer of the photoimageable system will typically be lost, either to polymerization or volatilization. Advantageously, at least 75 mole % of the monomer will survive the cure, more advantageously at least 90 mole %. In addition, a complete cure of the hybrid matrix precursor typically is not required. Although varying with the particular precursor used, a cure of about 80% of the precursor is generally sufficient to provide a matrix structure having acceptable physical properties (i.e., 20% of the potential reactive precursor functionality is unreacted). It is generally desired to perform the final cure at temperatures less than 100° C., to reduce premature polymerization. At such temperatures, it is often necessary to perform the cure for several hours or even days. A control sample is easily used to determine the appropriate cure conditions for a desired set of parameters. Upon conclusion of the cure, the photorecording medium is ready for data storage, e.g., by holographic methods such as those discussed previously.

In an advantageous embodiment, the hybrid matrix precursor is an organosiloxane oligomer derived from hydrolysis and condensation of one or more trifunctional organoalkoxysilanes, e.g., triethoxysilanes. Particularly useful trifunctional organoalkoxysilanes include methyltriethoxysilane, phenyltriethoxysilane, and mixtures of both methyltriethoxysilane and phenyltriethoxysilane. It is also possible to include some difunctional organoalkoxysilanes, e.g., dialkoxysilanes, to provide desired physical properties. In particular, the presence of the difunctional organoalkoxysilanes reduces the cross-link density in the matrix, thereby, it is believed, enhancing diffusion of the photoactive monomer in the medium. Formation of oligomeric precursor is accomplished by hydrolysis and condensation, thereby forming a branch siloxane ladder network. This oligomer formation step is typically carried out before the pre-cure, and a variety of such oligomeric materials are commercially available. As discussed previously, the organic moieties enhance the solubility of the photoactive organic monomer in the precursor, and also impart some flexibility to the final siloxane matrix. It is possible to commercially obtain organoalkoxysilanes as partially hydrolyzed organosiloxane oligomer, as either a liquid or a solid form known as flake.

Where organosiloxane oligomer flake is used, it is mixed with a solvent, typically butanol, to form a solution. It is also possible to add a solvent to liquid organosiloxane matrix precursor, whether monomer, oligomer, or both monomer and oligomer, to adjust the precursor's viscosity to a desired level. Acetone is particularly effective for this purpose, requiring only a small amount for substantial reduction of viscosity. A pre-cure is advantageously performed on the oligomeric organosiloxane precursor. Before and during the pre-cure, portions of the solvent and condensation products, which are generally volatile, typically evaporate. The pre-cure is generally performed at a temperature of about 100 to about 160° C., for a relatively short time period of about 10 minutes or less. The pre-cure promotes further condensation of the oligomer precursor, thereby raising the viscosity.

The pre-cured organoalkoxysilane matrix precursor is typically mixed with solvent to lower the viscosity, in order to promote mixing with the photoimageable system. As mentioned previously, the bulk of the solvent is then removed by heating gently under vacuum, which also drives the matrix condensation further. The process is then stopped when a desired weight is obtained. The mixture is then finally cured to form, in situ, a matrix of an inorganic-organic branch siloxane ladder network. Due to the effect of the pre-cure, the final cure is typically performed at a relatively low temperature of about 60 to about 80° C., for a relatively long period of time, e.g., over 50 hours. This temperature range is sufficient to continue the condensation started during pre-cure, but generally low enough to reduce premature polymerization of the photoactive monomer in the photoimageable system. A complete cure of the siloxane matrix is not required to form a useful medium. As discussed generally above, a cure of about 80% is typically adequate to provide the desired structural integrity.

Fabrication of the recording medium typically involves depositing the matrix precursor/photoimageable system mixture between two plates using, for example, a gasket to contain the liquid mixture. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. During the matrix cure, it is possible for shrinkage in the material to create stress in the plates, such stress altering the parallelism and/or spacing of the plates and thereby detrimentally affecting the medium's optical properties. To reduce such effects, it is useful to place the plates in an apparatus containing mounts, e.g., vacuum chucks, capable of being adjusted in response to changes in parallelism and/or spacing. In such an apparatus, it is possible to monitor the parallelism by use of a conventional interferometric method, and make any necessary adjustments.

Figure 7:
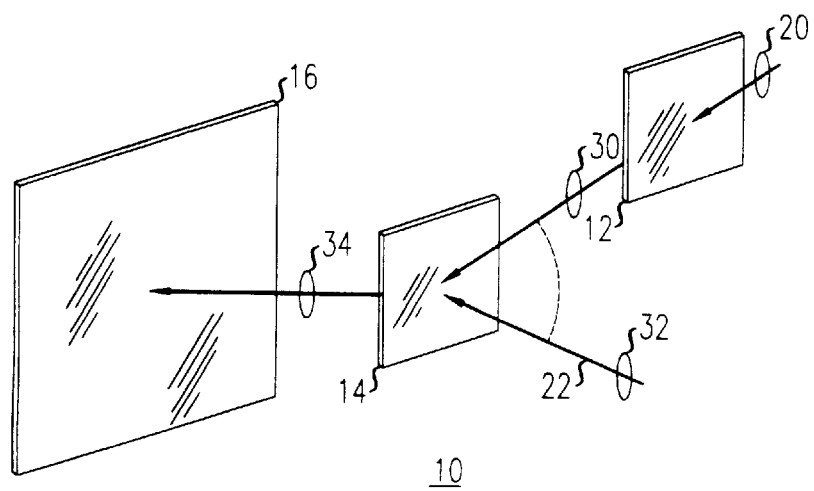
FIG. 7 shows a schematic of a holographic recording apparatus.

FIG. 7 illustrates the basic components of a holographic system 10 suitable for use with the photorecording medium of the invention. System 10 contains a modulating device 12, a photorecording medium 14, and a sensor 16. Modulating device 12 is any device capable of optically representing a two-dimensional page of information. Device 12 is typically a spatial light modulator that is attached to an encoding unit which encodes a page of information onto the modulator. Based on the encoding, device 12 selectively passes or blocks portions of a signal beam 20 passing through device 12. In this manner, beam 20 is encoded with an information page image. The page image is stored by interfering the encoded signal beam 20 with a reference beam 22 at a location on or within photorecording medium 14. The interference creates an interference pattern (or hologram) that is captured via photoinduced polymerization within medium 14 as a pattern of, for example, varying refractive index and/or absorption. It is possible for more than one holographic image to be stored at a single location, or for holograms to be stored in overlapping positions, by, for example, varying the angle, the wavelength, or the phase of the reference beam 22. Signal beam 20 typically passes through lens 30 before being intersected with reference beam 22 in the medium 14. It is possible for reference beam 22 to pass through lens 32 before this intersection.

After the imaging process has been completed, the recording medium 14 is subjected to a flood exposure that polymerizes any remaining photoactive material. This flood exposure thereby fixes the system, in a photographic sense. It is then possible to retrieve the information by intersecting reference beam 22 with medium 14 at the same location and at the same angle, wavelength, or phase (as in phase correlation multiplex holography, discussed previously) at which reference beam 22 was directed during storage of the information. The reconstructed information page passes through lens 34 and is detected by sensor 16. Sensor 16 is, for example, a charged coupled device or an active pixel sensor. Sensor 16 typically is attached to a unit that decodes the information page.

EXAMPLE 1

Several recording media were made according to the following process. Partially hydrolyzed and condensed oligomeric matrix precursor derived from methyltriethoxysilane and phenyltriethoxysilane (in a 1:1 mole ratio of methyl to phenyl) was obtained from Owens-Illinois (Toledo, Ohio) in flake form. A solution of the precursor in acetone, at a concentration of 0.25 g/cm$^3$, was filtered with a 50-micron mesh screen to remove particulates. A pre-cure was then performed by heating the mixture up to about 120° C., while vigorously stirring. The residue recovered after evaporation of the solvent and evolution of ethanol (which was the condensation product) was redissolved in acetone. To the solvated residue was added 10 wt. % of lauryl acrylate monomer, based on the weight of the initial oligomeric matrix precursor, and 5 wt. % of a titanocene organometallic photoinitiator (CGI 784 obtained from Ciba-Geigy) based on the weight of the monomer. The resulting mixture was heated to about 80° C., and then poured into an o-ring placed onto a glass plate, the o-ring having a diameter of about 3 cm and a thickness of about 300 µm. A second glass slide was placed over the o-ring, and the sample was cured at 80° C. for 50 hours in a convection oven. The cured samples were transparent, and exhibited desirable optical quality (e.g., good thickness uniformity, low level of bubbles and other internal imperfections).

EXAMPLE 2

The effect of the final matrix resin cure of Example 1 on the lauryl acrylate monomer was monitored for two samples, using infrared spectroscopy (IR) and nuclear magnetic resonance spectroscopy (NMR). For IR analysis, a sample was prepared according to Example 1, but using NaCl plates instead of glass. Spectra were acquired on a BOMEN Michelson 100 FTIR spectrometer at 1 hour intervals for the first 10 hours, and at 5 hour intervals for the remainder of the cure. NMR analysis of a solid sample was performed with a zirconium NMR rotor, and C and Si NMR spectra were recorded on a Varian Unity 400 Spectrometer at frequencies of 100.5 and 79.5 MHz, respectively. The NMR spectra were taken at the beginning of the cure cycle (non-spinning spectra) and at the end of the cure cycle (magic angle spinning spectra at 5.6 kHz). In performing the NMR analysis, contact times of 1000 and 2500 µs were used for H—C and H—Si cross-polarization, respectively. High power proton decoupling was employed during the NMR analyses at both the beginning and end of the cure.

Figure 2A:
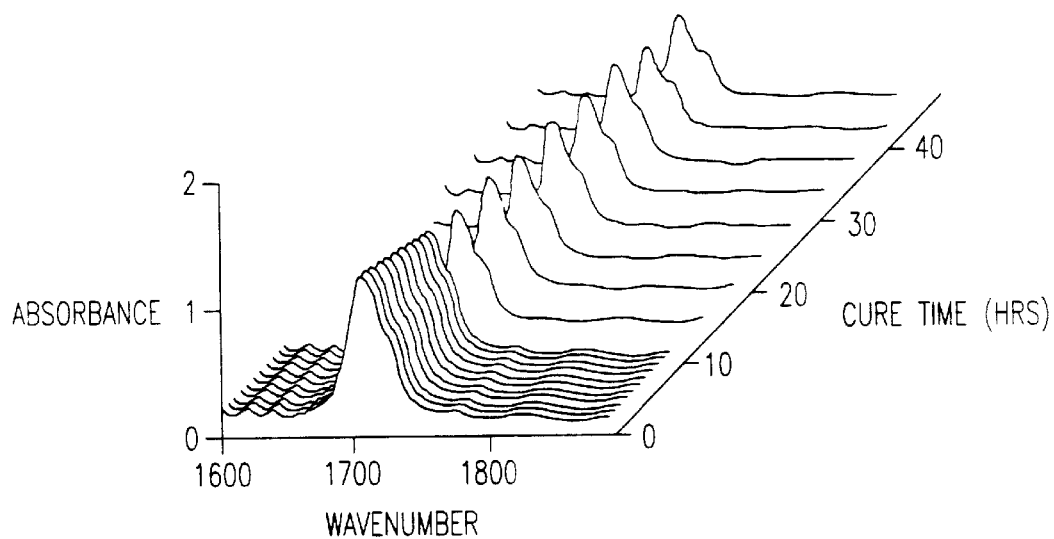
FIGS. 2A and 2B reflect isolated data from the IR spectra of FIG. 1.
Figure 2B:
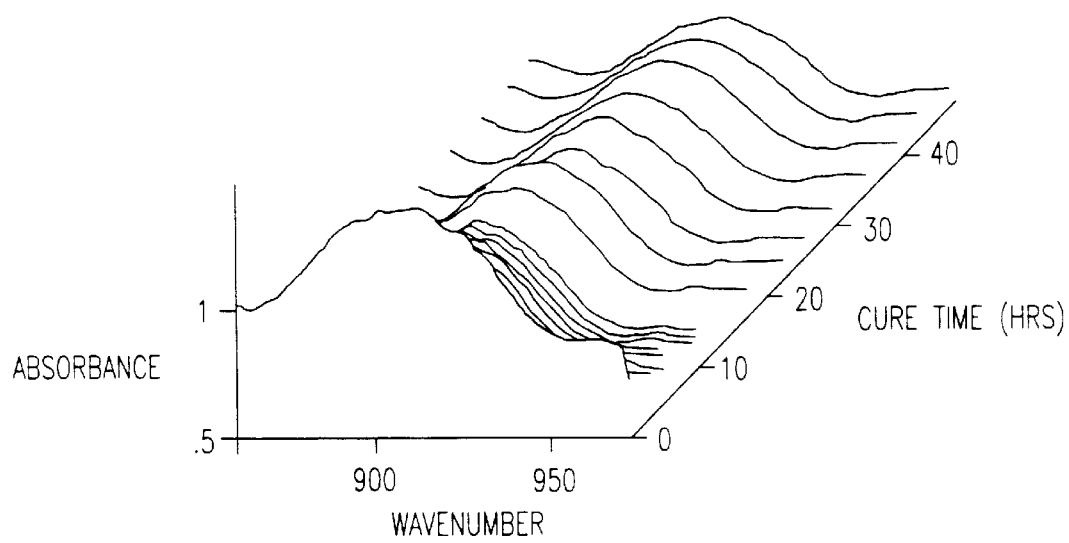

FIG. 1 shows the IR spectra recorded over the 50 hour final cure. The survival of the acrylate during the cure is reflected in FIGS. 2A and 2B, which reflect the acrylate carbonyl stretch (1705 cm$^{-1}$) and acrylate C=CH$_2$ wag absorption (910 cm$^{-1}$), isolated from the data of FIG. 1. In FIG. 2A, the peak absorption intensity decreases to approximately 80% of its original value. However, acetone carbonyl absorbs in the same wavelength region, and the loss in absorption intensity is possibly due to volatilization of residual solvent during the cure. FIG. 2B shows a band of relatively constant intensity, due to the acrylate CH$_2$ moiety, over the cure. Acrylate C=C bands were obscured by the organosilicate bands, and thus could not be used as a monitor. The IR data therefore did not provide an exact quantification of acrylate survival in the recording medium.

Figure 3A:
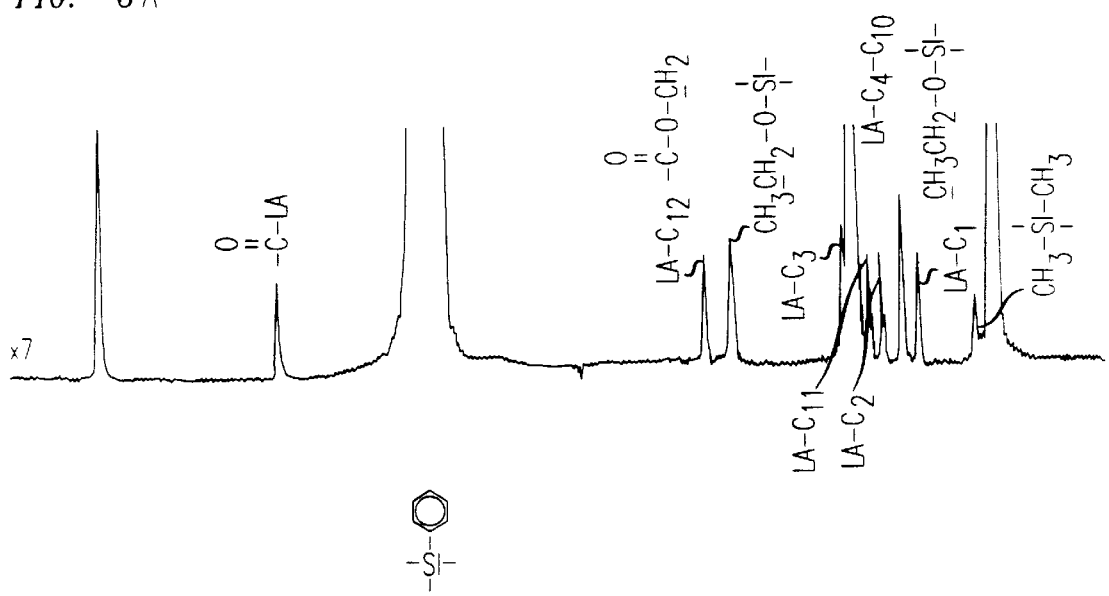
FIGS. 3A and 3B show the NMR spectrum of a recording medium of the invention, prior to final cure, at 7× and 1×, respectively.
Figure 3B:
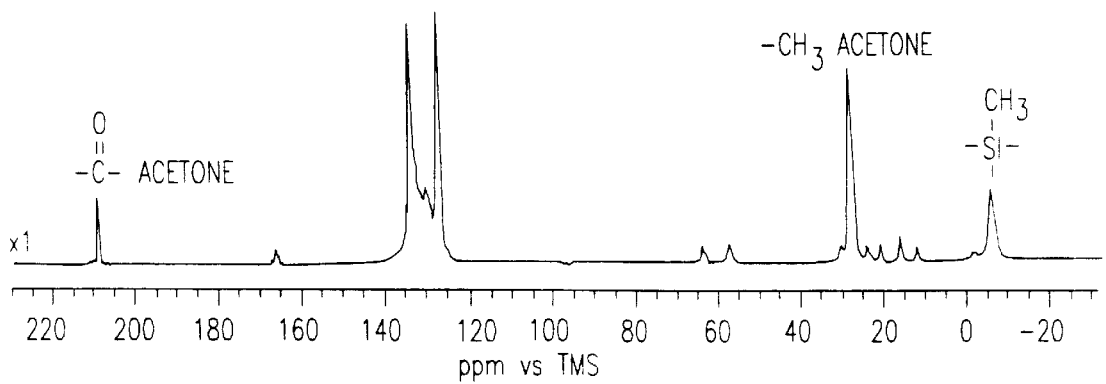
Figure 4A:
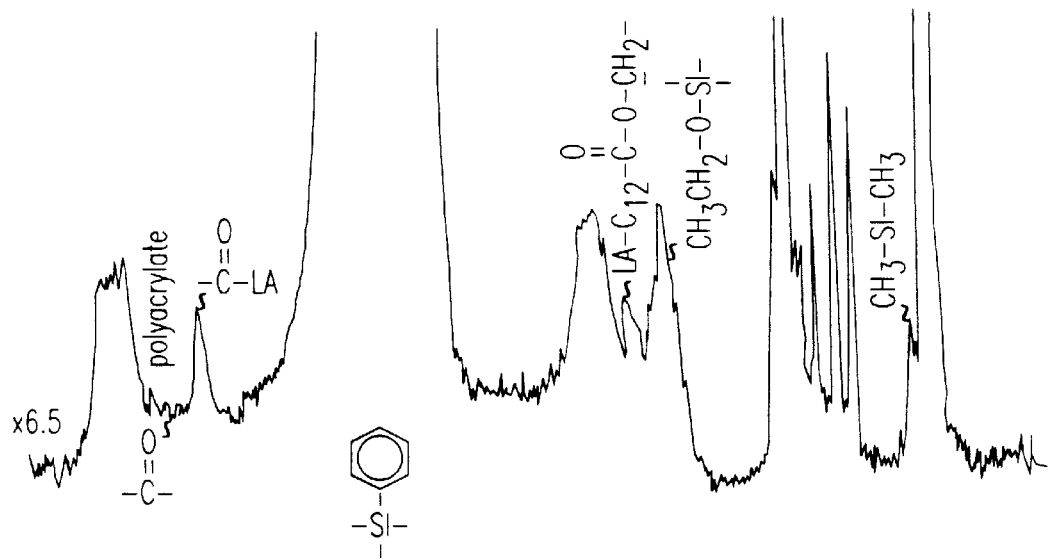
FIGS. 4A and 4B show the NMR spectrum of a recording medium of the invention, after final cure, at 6.5× and 1×, respectively.
Figure 4B:
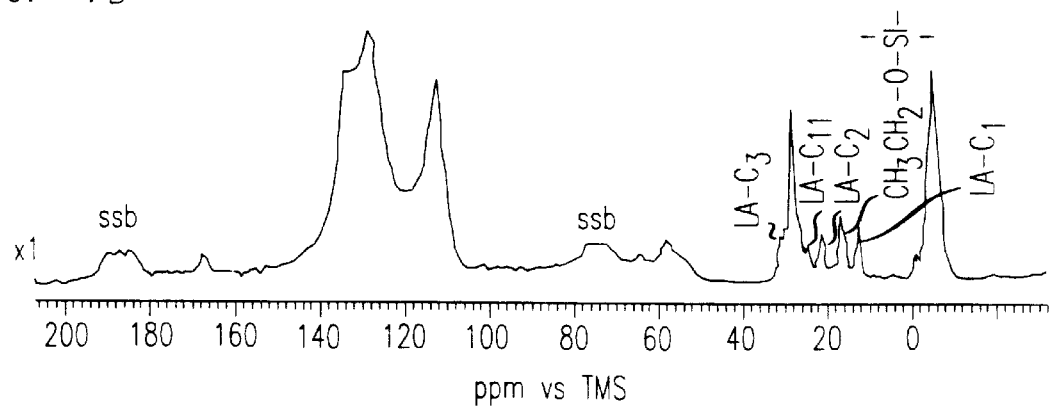

FIGS. 3A and 3B show the NMR spectrum of the sample before the final cure, at 7× and 1×, respectively, on a tetramethylsilane scale. Relevant resonances from the medium material are noted, along with the residual acetone. The carbonyl signal (166.3 ppm) was again used to monitor stability of the acrylate during the cure, since the aromatic resonances of the phenylsiloxane obscure acrylate olefinic carbons. Signals of methylene and methyl carbons, at 58.5 and 18.0 ppm, respectively, provide evidence of residual ethoxy groups. The small resonance at 0.3 ppm indicates presence of a small amount of dimethylsiloxane units in the network, believed to arise from a difunctional impurity in the trifunctional precursor. The post-cure NMR spectrum is shown in FIGS. 4A and 4B, at 6.5× and 1×, respectively. The absence of a resonance at 173 ppm, which represents the carbonyl signal in a polymerized acrylate, indicates that the monomer was thermally stable at the cure conditions. However, a comparison of the spectra before and after the cure indicated that about 75% of the monomeric acrylate remained after the cure. It is believed that a small portion of the acrylate monomer is lost due to volatilization, as opposed to polymerization.

Figure 5:
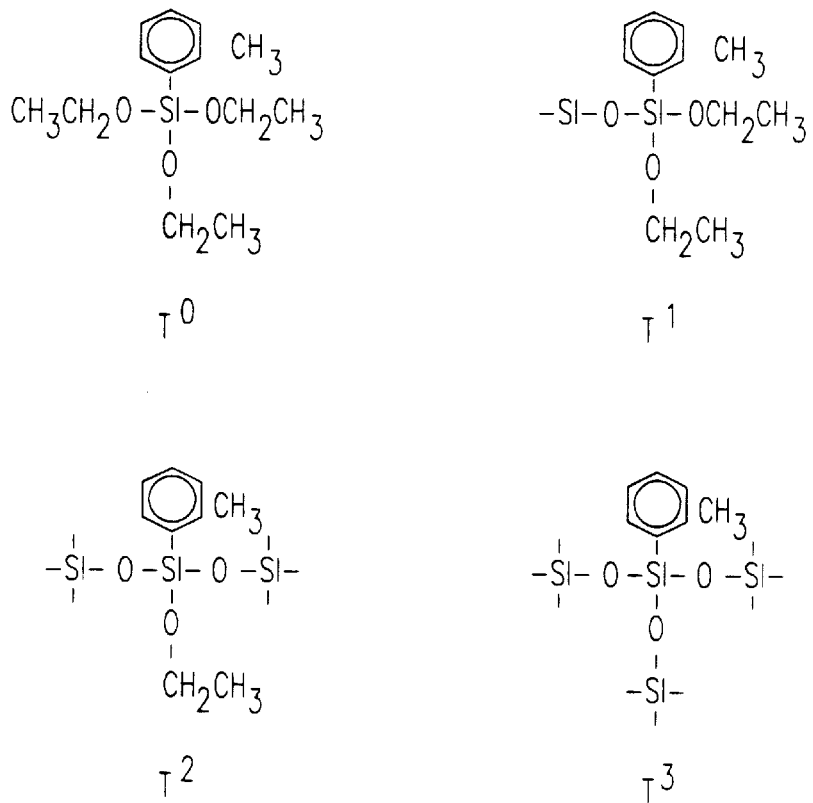
FIG. 5 shows the chemical structures for organoalkoxysilanes used in the Examples.
Figure 6A:
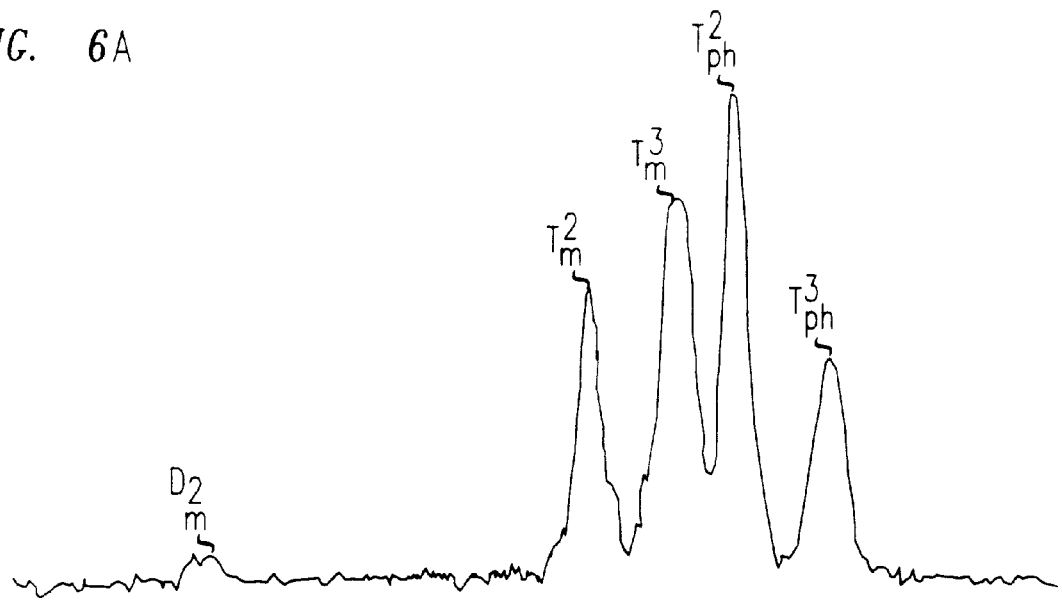
FIGS. 6A and 6B show the NMR spectra before and after the final cure, respectively, reflecting the extent of reaction of the organoalkoxysilanes of FIG. 5.
Figure 6B:
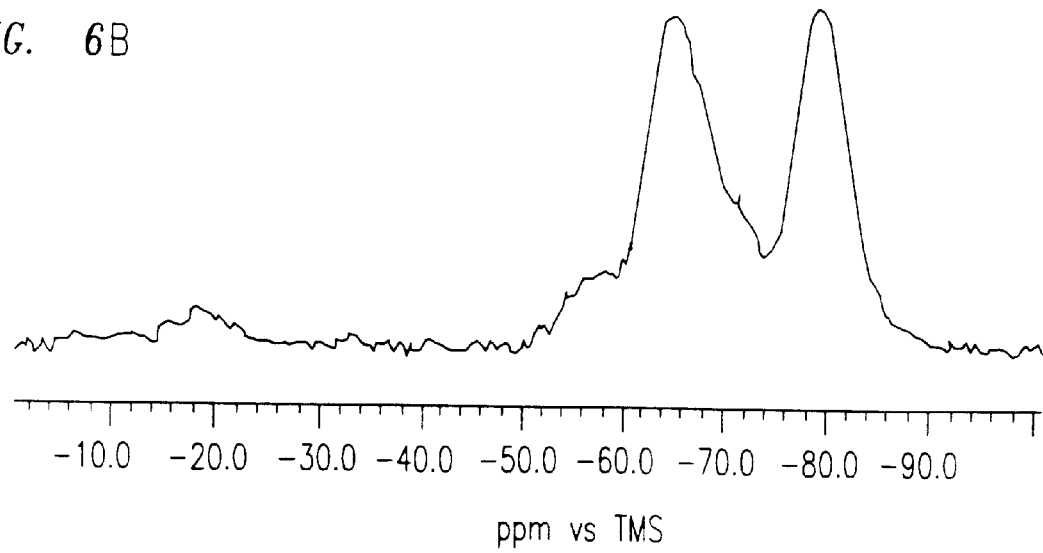

NMR also provided information on matrix formation. FIG. 5 shows the chemical structures for the organosiloxanes used in Example 1. T$^0$ represents the basic monomer, and T$^1$, T$^2$, and T$^3$ represent successive stages of hydrolysis-condensation of the T$^0$ monomer. FIGS. 6A and 6B show the NMR spectra before and after the final cure, respectively, with the "m" subscript indicating a methyl moiety and a "ph" subscript indicating a phenyl moiety. Because the organosiloxanes were obtained as partially hydrolyzed oligomer, the NMR spectrum of FIG. 6A shows primarily T$^2$ and T$^3$, with a small amount of dimethylsiloxane (D$^2_m$). The extent of cure, i.e., the extent of network formation, prior to the final cure was estimated at about 84%. FIG. 6B shows the NMR spectrum after the final cure. The peaks are similar, differing slightly in intensity and breadth. FIG. 6B shows that further matrix formation occurred during the cure, but, not to 100% reaction.

EXAMPLE 3

Figure 8:
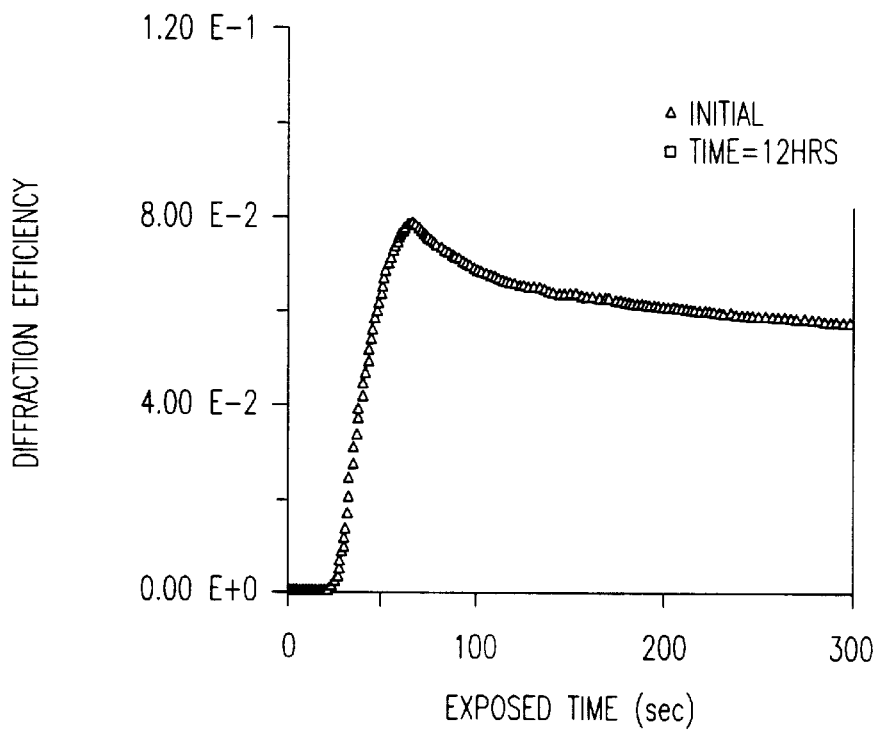
FIG. 8 shows diffraction efficiency of a hologram written into a medium made according to the invention.

A basic holographic analysis was performed on a sample made according to Example 1, but having a material thickness of 100 µm. A shift-multiplex configuration was used, in which partially-overlapping holograms are recorded sequentially, each at a new position of the shifted medium, with differentiation during read-out enabled by Bragg selectivity. The signal and reference beams were generated by a diode-pumped, frequency-doubled YAG laser, and exhibited a wavelength of 532 nm. A single unslanted plane-wave hologram was recorded in the medium with a 10 second exposure at an intensity of about 3 mW/cm² (unslanted indicating a medium orientation normal to the bisect of the reference and signal beams). The intensities of the two beams were approximately equal and the hologram d-spacing was maintained at about 839 nm. A 1 mW HeNe laser emitting radiation at 632 nm was utilized as a probe beam to monitor initial stages of hologram formation in real time. The extent of diffraction by the HeNe probe was taken as an indicator of hologram strength. Although the HeNe probe does not provide a true quantitative measure of hologram strength, the method is qualitatively useful. The data obtained by the HeNe probe are reflected in FIG. 8. The Figure shows that maximum diffraction efficiency is achieved within a few seconds.

Figure 9:
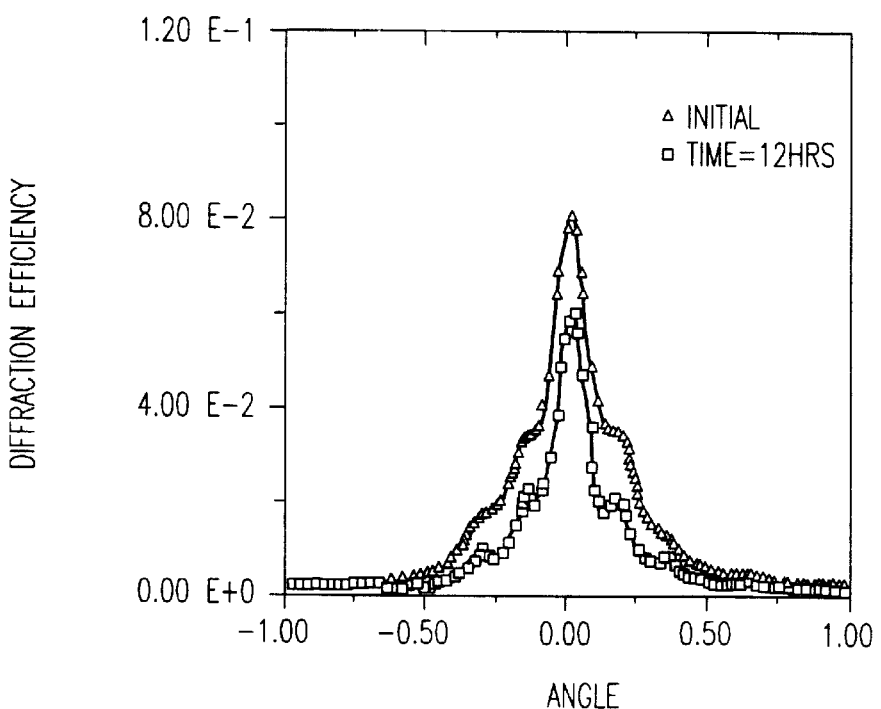
FIG. 9 shows the effect of prolonged flood exposure on a medium made according to the invention.

After hologram writing, the sample was flood cured with a xenon lamp, with output filtered to yield an intensity of 10 mW/cm² in the visible spectrum, for about 10 to 20 seconds. The flood cure stabilized the system against further photo-reaction during hologram read-out. Continued flood illumination was performed for 12 hours to test the permanence of the hologram. Results after the initial flood illumination, and the 12 hour illumination are shown in FIG. 9. The medium exhibited a slight decrease in diffraction efficiency after the 12 hour illumination. The mechanism for this decrease appears to be the bleaching of part the hologram due to the presence of the photoinitiator, i.e., a photoinitiator absorption grating was superimposed over the plane wave hologram. Residual diffraction, due to the hologram induced by the refractive index pattern of the photopolymer, did not degrade in intensity and was observed to be permanent.

Other embodiments of the invention will be apparent to those skilled in the art from consideration of the specification and practice of the invention disclosed herein.

What is claimed is:

1. A process for holography, consisting essentially of the steps of:

irradiating selected regions of a photorecording medium, wherein the photorecording medium comprises a hybrid inorganic-organic matrix consisting essentially of a three-dimensional organic backbone that comprises a metallic element, wherein every atom of the metallic element has at least one attached organic group, and a photoimageable system distributed within the matrix, the photoimageable system comprising a photoactive monomer, wherein the matrix and the photoimageable system exhibit independent chemistries, and wherein the matrix is a layer having a thickness greater than 100 µm; and performing a flood cure.

2. The process of claim 1, wherein the matrix is a layer having a thickness greater than 1 mm.

* * * * *